United States Patent [19]
Hatakeyama et al.

[11] Patent Number: 6,007,969
[45] Date of Patent: Dec. 28, 1999

[54] ULTRA-FINE MICROFABRICATION METHOD USING AN ENERGY BEAM

[75] Inventors: Masahiro Hatakeyama; Katsunori Ichiki, both of Fujisawa; Yotaro Hatamura, 2-12-11 Kohinata, Bunkyo-ku, Tokyo, all of Japan

[73] Assignees: Ebara Corporation; Yotaro Hatamura, both of Tokyo, Japan

[21] Appl. No.: 08/610,235

[22] Filed: Mar. 4, 1996

[30] Foreign Application Priority Data

| Mar. 2, 1995 | [JP] | Japan | 7-043212 |
| Mar. 2, 1995 | [JP] | Japan | 7-043214 |
| Mar. 2, 1995 | [JP] | Japan | 7-043217 |
| Mar. 17, 1995 | [JP] | Japan | 7-086538 |

[51] Int. Cl.$^6$ .............. G03C 5/00; B44C 1/22; B05D 3/00
[52] U.S. Cl. .............. 430/323; 427/552; 216/48; 216/94; 430/5
[58] Field of Search ................ 430/4, 5, 322, 430/323; 427/551, 552; 216/42, 48, 94

[56] References Cited

U.S. PATENT DOCUMENTS

| 3,680,028 | 7/1972 | Black et al. | 338/308 |
| 4,352,835 | 10/1982 | Holbrook et al. | 427/38 |
| 4,407,695 | 10/1983 | Deckman et al. | 156/643 |
| 4,664,748 | 5/1987 | Ueno et al. | 156/659.1 |
| 4,835,392 | 5/1989 | Löschner et al. | 250/492.2 |
| 5,256,587 | 10/1993 | Jun et al. | 437/52 |
| 5,382,315 | 1/1995 | Kumar | 156/643 |
| 5,466,627 | 11/1995 | Lur et al. | 437/52 |
| 5,656,349 | 8/1997 | Gomi et al. | 428/65.3 |
| 5,871,870 | 2/1999 | Alwan | 430/5 |

OTHER PUBLICATIONS

Fusao Shimokawa et al., "Reactive–fast–atom beam etching of GaAs using $Cl_2$ gas", J. Appl. Phys. 66(6),Sep. 15, 1989, published by 1989 American Institute of Physics, 1989, pp. 2613–2618.

Tetsuro Nakamura et al., "Fabrication Technology of Integrated Circuit", published by Sangyo Tosho Publishing Company (Japan), 1987, pp. 21–23 (includes English translation).

Masayuki Nakao et al., "3–dimensional Handling in Nano Manufacturing World", Proceedings of 71st Fall annual meeting of the Japan Society of Mechanical Engineers, published by the Japan Society of Mechanical Engineers, 1993, vol. F, pp. 273–275 (includes English Abstract).

Masayuki Nakao et al., "Realization of 3–D Manufacturing in Nano Manufacturing World", Proceedings of 71st Spring annual meeting of the Japan Society of Mechnical Engineers, published by the Japan Society of Mechanical Engineers, 1993, vol. IV, pp. 485–486 (includes English Abstract).

U.S. Patent Application Serial No. 08/617,356, filed Mar. 18, 1996, entitled "Fabrication Method with Energy Beam and Fabrication Apparatus Therewith", by Masahiro Hatakeyama et al.

U.S. Patent Application Serial No. 08/621,990, filed Mar. 26, 1996, entitled "Micro–Processing Apparatus and Method Therefor", by Masahiro Hatakeyama et al., located in Group Art Unit 2506.

Primary Examiner—Janet Baxter
Assistant Examiner—Rosemary Ashton
Attorney, Agent, or Firm—Wenderoth, Lind & Ponack, L.L.P.

[57] ABSTRACT

An ultra-fine microfabrication method using an energy beam is based on the use of shielding provided by nanometer or micrometer sized micro-particles to produce a variety of three-dimensional fine structures which have not been possible by the traditional photolithographic technique which is basically designed to produce two-dimensional structures. When the basis technique of radiation of an energy beam and shielding is combined with a shield positioning technique using a magnetic, electrical field or laser beam, with or without the additional chemical effects provided by reactive gas particle beams or solutions, fine structures of very high aspect ratios can be produced with precision. Applications of devices having the fine structures produced by the method include wavelength shifting in optical communications, quantum effect devices and intensive laser devices.

41 Claims, 13 Drawing Sheets

F I G. 1
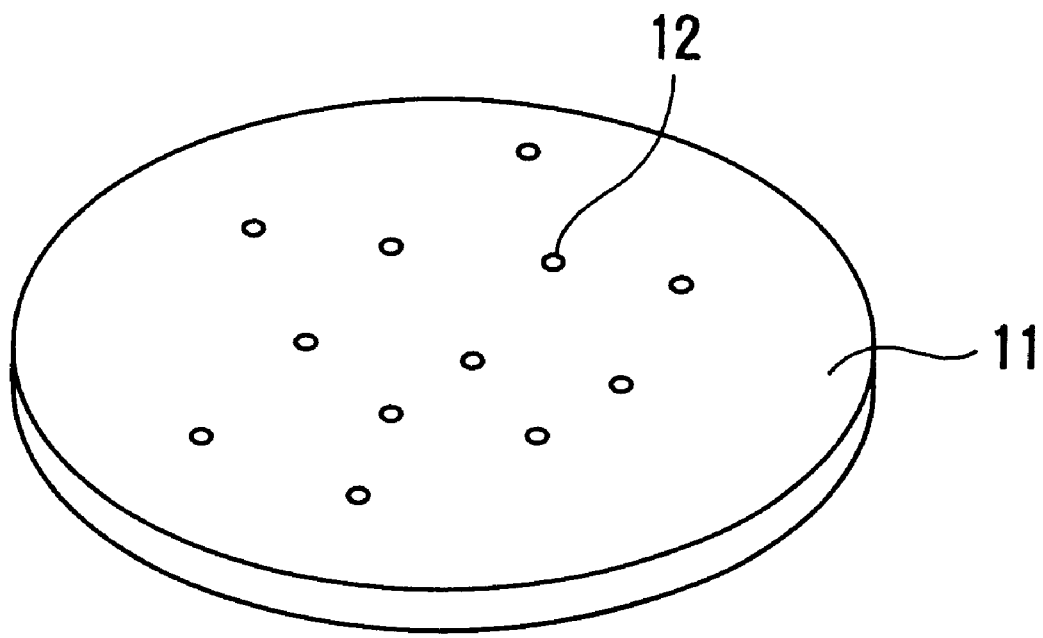

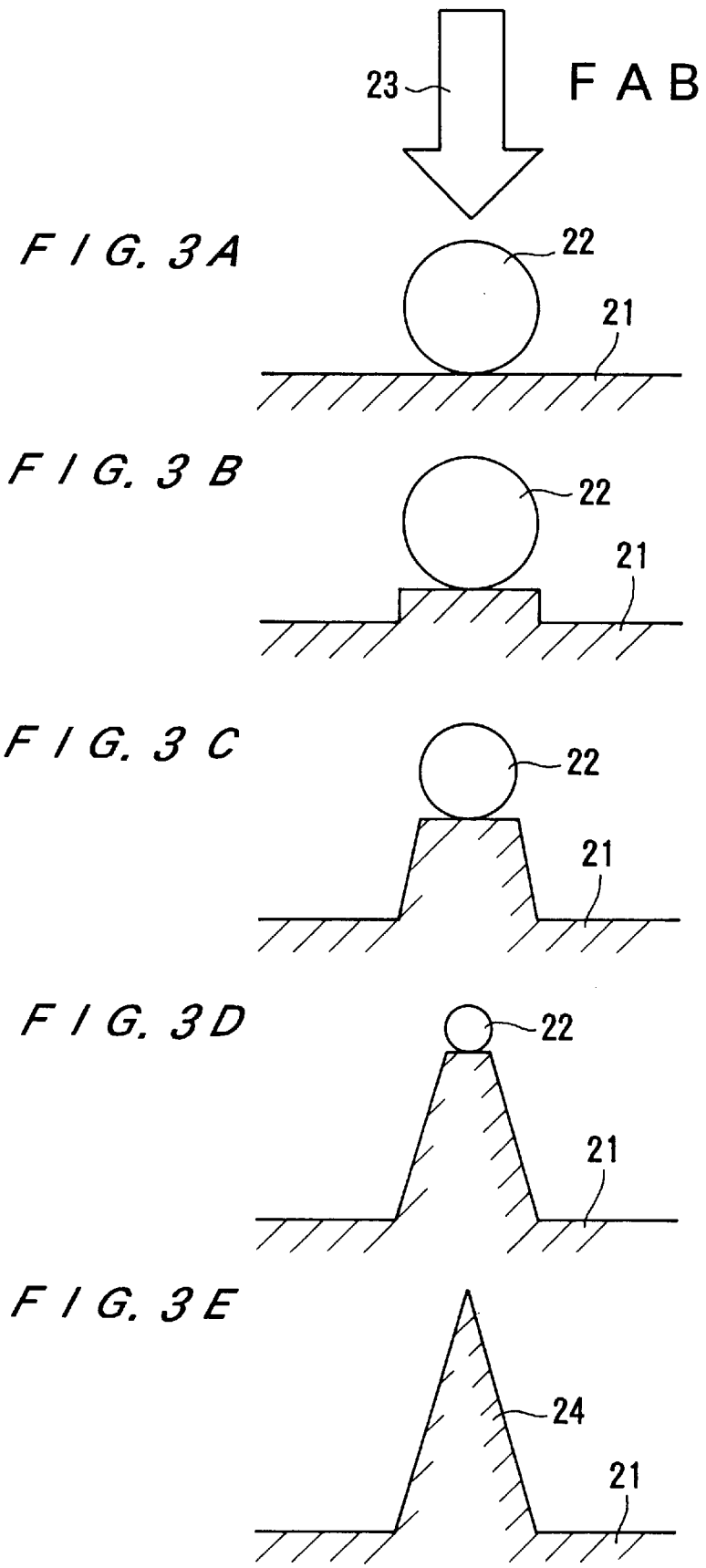

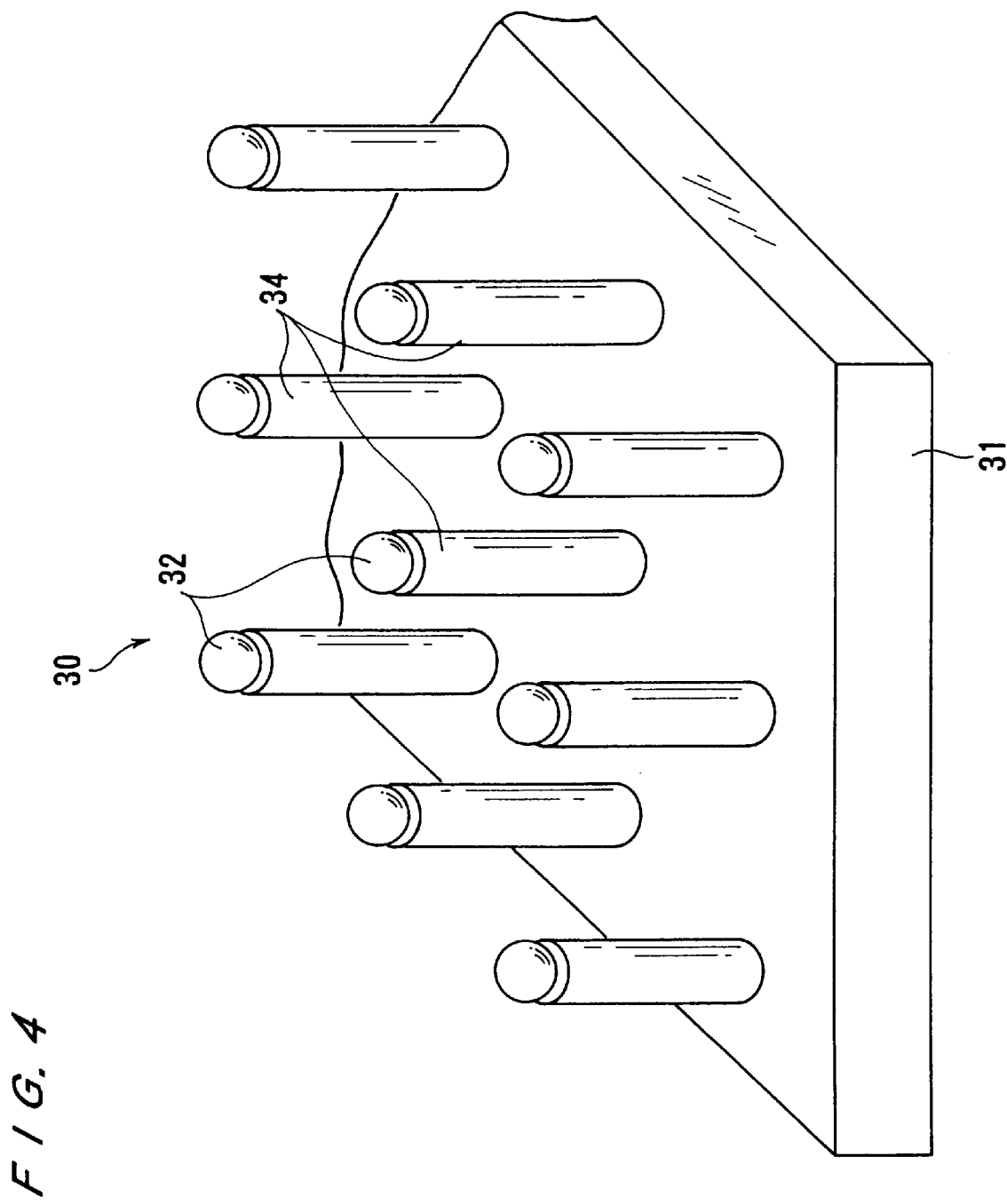
F/G. 4

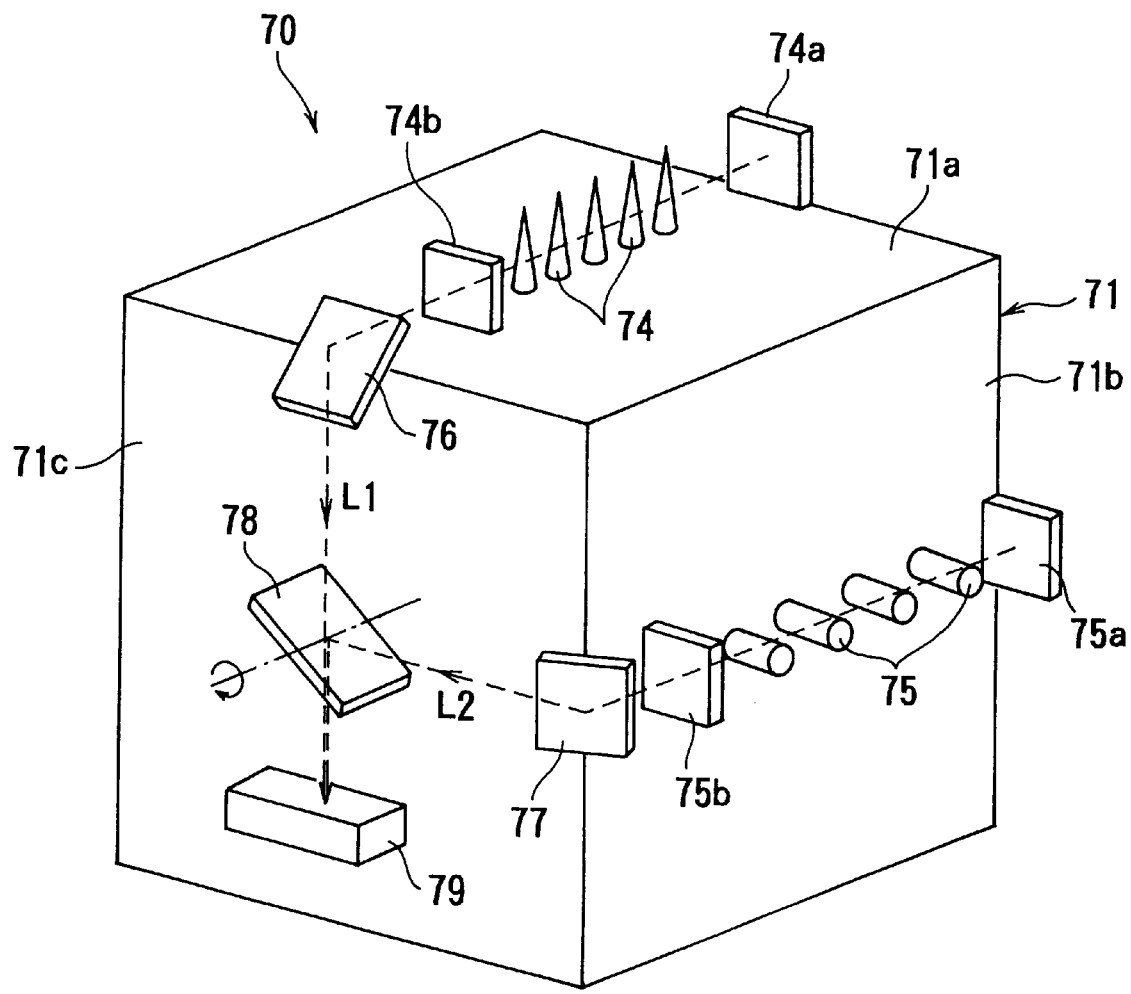
F I G. 8

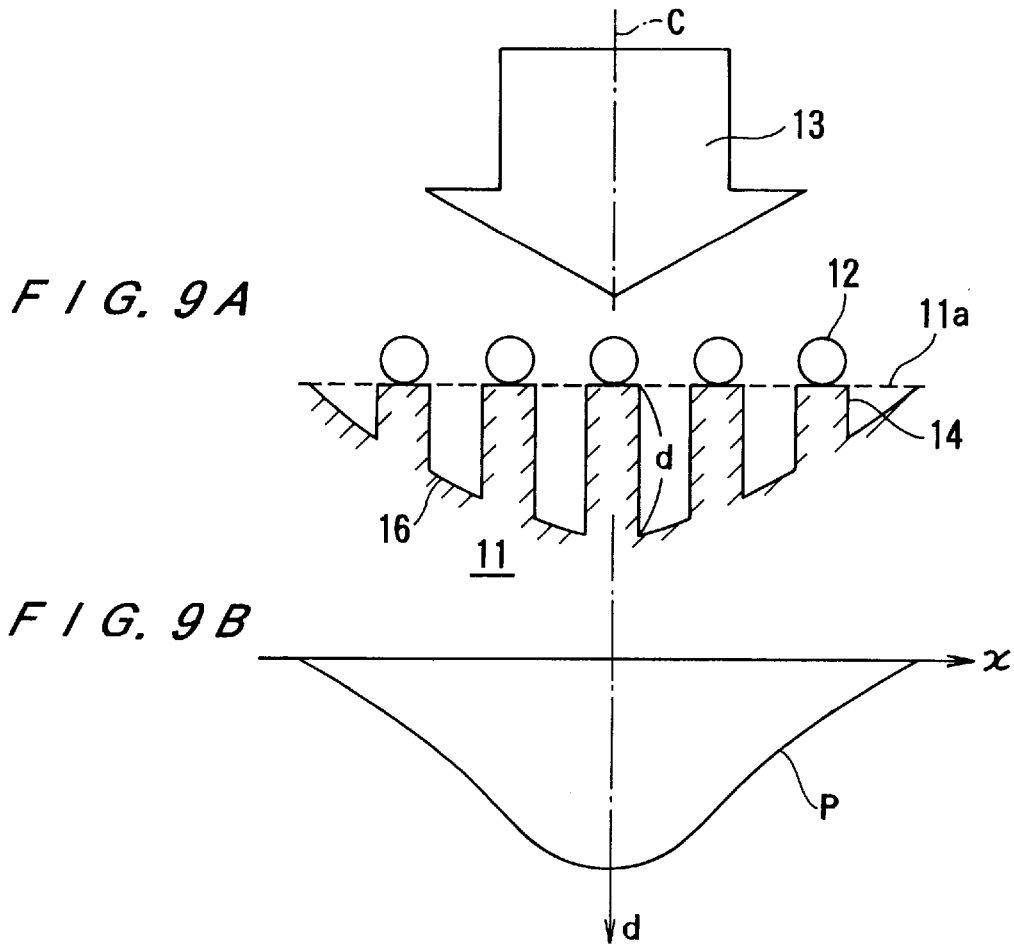
FIG. 9A
FIG. 9B
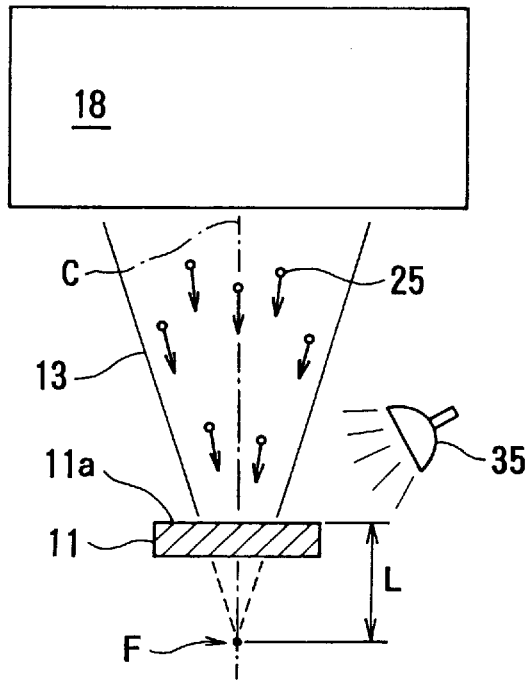
FIG. 10

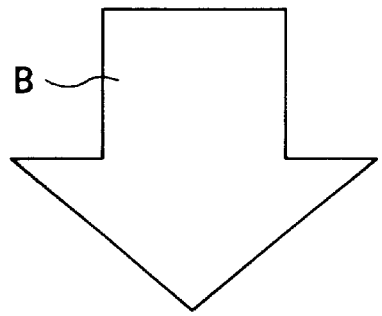
F I G. 1 2 A
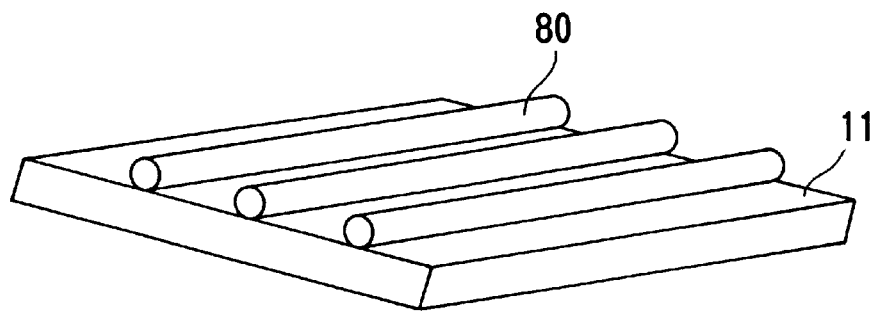
F I G. 1 2 B
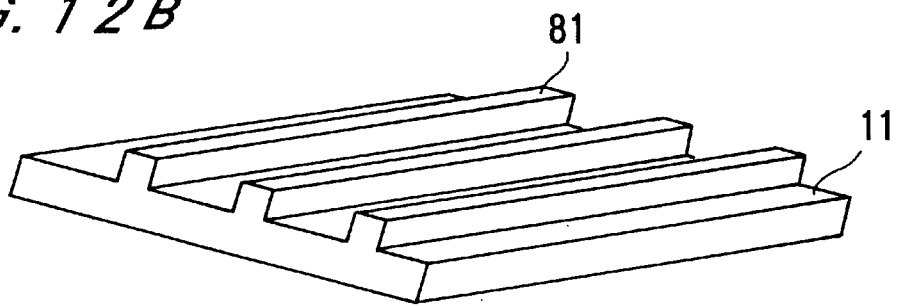
F I G. 1 2 C
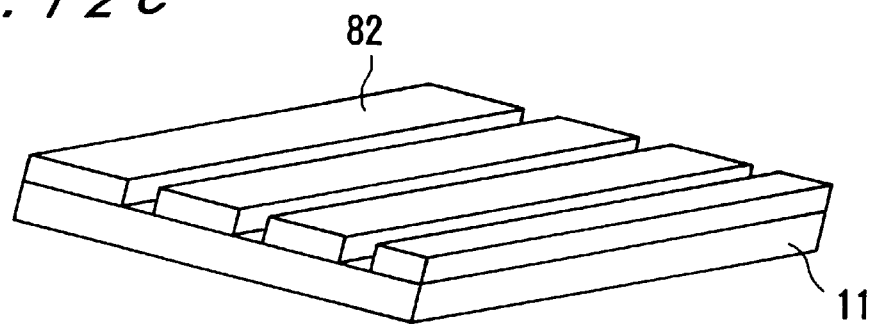

ULTRA-FINE MICROFABRICATION METHOD USING AN ENERGY BEAM

BACKGROUND OF THE INVENTION

1. Field of the Invention

The present invention relates in general to a method of fabricating materials, and relates in particular to a method of ultra-fine microfabrication using an energy beam to fabricate next generation VLSI devices, ultra-fine structures, quantum effect devices and micro-machined devices, and relates also to evaluating the fabrication properties of the energy beam using the method.

2. Description of the Related Art

Photolithography and photomasking to generate a device pattern on a substrate base have been an essential part of fabrication of semiconductor devices. A photolithographic device fabrication process is based on masking those regions of the substrate base which are not to be etched with a photoresist mask, and etching the base material away from those regions which are not protected by a photoresist mask, thereby producing on the fabrication surface ditches or recesses whose depths are dependent on the duration of etching.

FIGS. 15A–15E illustrate the processing steps (step 1 through step 5, respectively) involved in the conventional technique based on the use of photoresist masking. In step 1, the surface of a substrate base 1 is coated with a photoresist material 2. In step 2, ultraviolet light 4 is radiated on the photoresist material 2 through a photomask 3 placed on top of the coated base 1, thereby transferring device patterns 3a formed in photomask 3 to the photoresist material 2. In step 3, the photoresist material 2 exposed by the photomask 3 is removed in a photographic development process to leave behind only the unexposed regions of the photoresist material on the base 1. In the following step 4, unisotropical etching is carried out to remove the base material from the fabrication surface by using ions or radicals in a plasma etching process on those bare regions of the base 1 not protected by the photoresist material 2. In the final step 5, the photoresist material 2 is removed. These five steps are essential in the conventional technique to duplicate the pattern 3a of the photomask 3 by using photolithography to form ultra-fine ditches or recesses 1c in the surface of the base 1. In general, it is necessary to repeat those basic five steps a number of times to form ditches of different depths in the base 1 before an operative semiconductor device can be produced.

Therefore, throughout the process of conventional microfabrication presented above, various photomasks 3 having different complex photoresist patterns 3a are absolutely essential, and furthermore, lines or holes in the range of 1 $\mu$m or less are required in the photomasks, special equipment and effort are required, and both capital and labor expenses associated with the technique are rather high. Even with the best of equipment, the technique is basically not adaptable to microfabrication in the range of nanometers. Also, for the technique to be practical, photoresist material 2 must respond to ultraviolet light or electron beams, thereby limiting the choice of photoresist material which can be used. Further, the use of the technique is not allowed when there is a danger of the photoresist material becoming a contaminant. Further, the success of photolithography is predicated on precise flatness of the surface of the substrate base so that the entire fabrication surface lies on a flat plane, to enable uniform fabrication of the entire surface of the substrate base. When the fabrication surface lacks flatness or smoothness, it is not possible to produce a photoresist film of high uniformity and to produce a precise exposure over the entire surface.

Further, in using the conventional plasma etching process to produce patterns of less than 1 Am in size, because of the collision among the gas particles and charge accumulation on the resist material, too many of the charged particles are deviated from linearity, and strike the surface at some non-perpendicular angles to the surface. Under such conditions, it is difficult to produce deep vertical ditches or recesses having a high aspect ratio (a ratio of depth to width), and furthermore, it is nearly impossible to manufacture three-dimensional structural patterns having a width of less than 1 $\mu$m.

SUMMARY OF THE INVENTION

It is an object of the present invention to provide a method of energy beam-assisted ultra-fine microfabrication to enable fabrication of fine structures in a nanometer range by dispersing micro-particles as beam shielding means on a fabrication surface of a target object, and radiating the surface with an energy beam to produce the fine structures. The dispersion patterns of the microparticles can be controlled as necessary by applying a magnetic or electric field or a laser beam. To produce uniformly etched fine structures or fine structures having high aspect ratios, the etching process by energy beam radiation is followed by etching with chemically reactive gaseous particles or in a chemical solution. The method enables the production of ultra-fine structures which are dimensionally precise and have a high aspect ratio.

Another object of the present invention is to provide a method of evaluating the fabrication properties of an energy beam for use in microfabrication, such as fabricating speed, area, depth as well as unisotropical etching properties and other fabrication parameters such as the condition of the surface produced by the energy beam.

The first object is achieved in a method comprising the steps of dispersing and positioning micro-particles having particle sizes in ranges of one of from 1–10 nm, 2 from 10–100 nm and 2 from 100 nm to 10 $\mu$m, for shielding regions of a fabrication surface of a target object form exposure to an energy beam, and radiating the energy beam on the fabrication surface so as to produce a fine structure by an etching action of the energy beam on those regions of the fabrication surface which are not shielded.

An aspect of the method is that while the energy beam is fabricating the fabrication surface in the depth direction, the shielding member is also etched away to produce a cone-shaped fine structure. To enable the microfabrication method, dispersion of the micro-particles can be performed in one of two ways, i.e., dripping a solution containing the micro-particles onto the fabrication surface and drying the micro-particles on the surface, or immersing the target object in the solution and drying the micro-particles on the surface.

Another aspect of the method is that positioning of the shielding members is performed with the use of a laser beam or a magnetic/electric field on the micro-particles, and the energy is beam-fabricated object is further processed with a reactive gas, under thermal control of the fabrication surface, to produce an isotropically etched fine structure.

The method as summarized above, based on shielding provided by nano-size or micron-size particles and etching with an energy beam, makes it possible to produce fine structures which were not possible within the scope of conventional fabrication methods based on photolithographic techniques.

The object of providing an evaluation method of an energy beam is achieved in a method comprising the steps of attaching microparticles having a specific range of particle sizes on a fabrication surface of a target object, radiating an energy beam onto the fabrication surface for a specific time interval for producing the fine structure, and analyzing structural features of the fine structure.

When evaluating the fabrication properties of an energy beam, the size of the fine pattern is an important parameter. In the method of the present invention, the fine patterns are produced by placing and attaching micro-particles in any desired patterns on the test surface without being restricted by the availability of pre-fabricated patterns. Therefore, fine patterns of a wide range of sizes can be used with various energy beams to evaluate the fabricated depth and shapes by observing the fabricated surface with an electron microscope, thereby permitting evaluation of a wide variety of energy beams. The method is also applicable to a wide variety of qualities of the surface to be fabricated, which presented problems in the conventional photolithography technology, because the micro-particles may be simply dispersed on and attached in situ to the fabrication surface without being restricted by surface roughness or lack of flatness.

BRIEF DESCRIPTION OF THE DRAWINGS

FIG. 1 is a perspective view of a target object having microparticles attached to a fabrication surface.

FIGS. 3A–3E illustrate processing steps in a second method of microfabrication of the present invention.

FIG. 4 is a perspective view of an example of fabrication performed by arranging micro-particles in a two-dimensional periodic pattern on a fabrication surface of a target object, performed according to the microfabrication method of the present invention.

FIG. 8 is a perspective view of three-dimensional fine structures fabricated on a plurality of faces of a target object, produced according to the microfabrication method of the present invention.

FIG. 9A is an enlarged cross-sectional view of a spot on a target surface to illustrate the effect of distance form a center C of an energy beam on the depth d of etching achieved.

FIG. 9B is a graph showing a curve P relating the distance x from the center C of an energy beam on the x-axis and the fabrication depth d on the y-axis.

FIG. 10 is a schematic illustration of an apparatus for evaluating the focusing property of a fast atomic beam.

FIGS. 12A–12C are perspective views of objects produced by the microfabrication method by placing rod-shaped shielding members in a periodic pattern.

PREFERRED EMBODIMENTS OF THE INVENTION

Figure 2A:
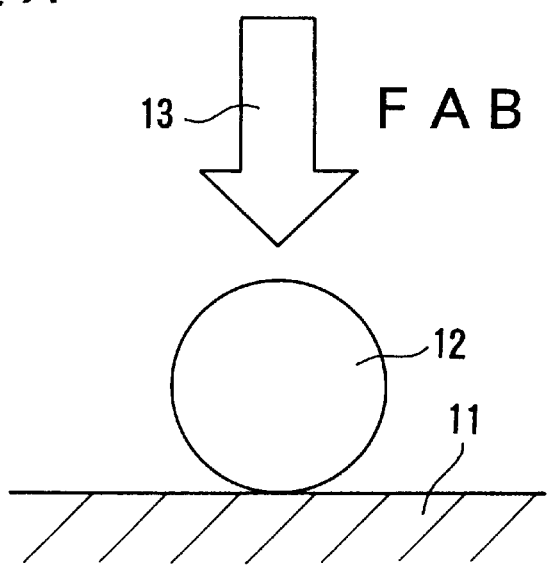
FIGS. 2A–2C illustrate processing steps in a first method of microfabrication of the present invention.

In the following, preferred embodiments will be explained with reference to FIGS. 1 to 14.

FIG. 1 is a perspective view of micro-particles 12 attached to a fabrication surface of a target object 11. The drawing illustrates a number of particles, wherein the size of the particle is of a predetermined size in a range on the order of nm or $\mu$m. The target object may be any of semiconductor materials including at least one of GaAs, Si, $SiO_2$, insulation materials including at least one of glass and ceramics and conductive materials such as metals.

A method of dispersing and attaching the micro-particles 12 on the fabrication surface of the target object 11 is to disperse the micro-particles 12 in a solvent such as ethanol and the like, stirred with a surfactant to obtain uniform dispersion. The target object 11 can then be immersed in the solution, or the solution can be dripped onto the fabrication surface to cover the fabrication surface with the dispersion solution. Subsequently, the solvent is removed by evaporation to leave only the micro-particles 12 in situ and uniformly distributed on the fabrication surface.

The particle diameter of the micro-particles 12 may be in the range of: one of 0.1–10 nm; 10–100 nm; and 100 nm to 10 $\mu$m. Ferrite, zinc, cobalt and diamond particles are in the 0.1–10 nm range, and aluminum, graphite, gold an silver particles are in the range of 100 nm to 10 $\mu$m. It is preferable that the microparticles 12 be spherical but other shapes are also employable, in which case, the range of particle sizes may be expressed in terms of the average diameter or the maximum diameter. It is desirable that the particle size be uniform, but this is not an essential requirement. If the size distribution is wide, a preferred range of particle sizes should be selected.

Figure 2B:
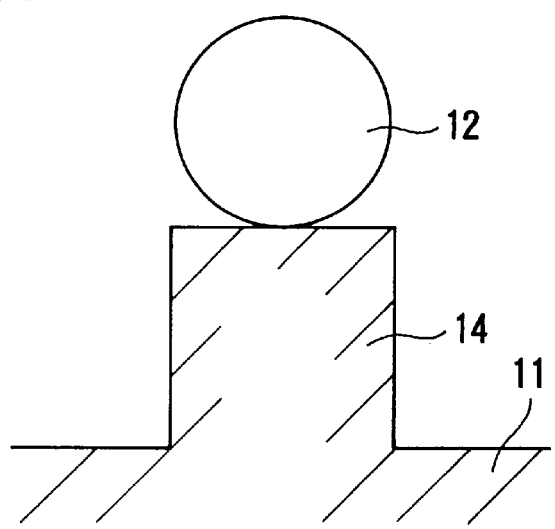
Figure 2C:
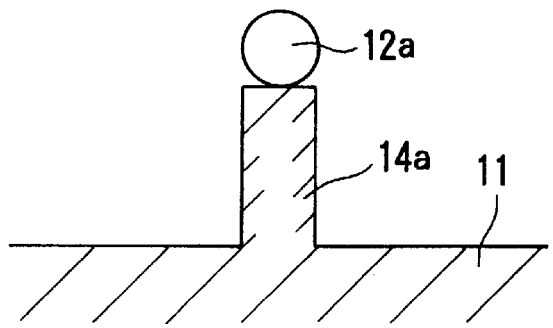

FIGS. 2A–2C illustrate processing steps in a first method of ultra-fine microfabrication method using an energy beam (shortened to microfabrication method hereinbelow).

As shown in FIG. 2A, micro-particles 12 made of materials such as cobalt, zinc and ferrite, having diameters ranging from 5 nm to 1 $\mu$m, are distributed on the surface of a target object 11 made of GaAs, Si or glass. The microparticles 12, distributed and attached to the fabrication surface by one of the two methods discussed above to shield the fabrication surface from the energy beam, are distributed uniformly with statistical accuracy.

Next, a fast atomic beam (FAB) 13 as an energy beam is radiated approximately perpendicular to the target object 11 along the direction shown by the arrow in FIG. 2A. Because the regions protected by the micro-particles 12 are shielded from the FAB 13, only those regions which are not protected by the micro-particles 12 are etched by the FAB 13, and the etching process proceeds as illustrated in FIG. 2B.

In this case, etching by the FAB 13 is effected not only on the target object 11 but also on the micro-particles 12 which gradually become smaller with continuing exposure to the radiation. However, the speed of shrinking of the micro-particles 12 will depend on their reactivity with the gas used for the FAB 13. To produce a fine-structure having a high aspect ratio, therefor, the FAB 13 is chosen to be either a rare gas or a gas having a low reactivity with the micro-particles 12 but a high reactivity with the material of the target object 11 so that shrinking of the micro-particles 12 can be controlled to be as little as possible. The result is that it is possible to leave only those shielded areas of the target object 11 below the micro-particles 12 unetched to produce vertical walls of a rod-shaped fine structure. Thus the structure remaining on the surface of the target object 11 is a fine structure of rod-shaped protrusions whose diameter ranges between 5 nm to 1 μm. The uniformity of the structure is dependent on the uniformity of the particle size of the micro-particles 12.

After the radiation processing of the target object 11 with an energy beam has been completed, gaseous particles of chlorine or fluorine for example, which are reactive with the target object 11, may be introduced while heating the target object 11 with a heater or an infrared lamp. Then, isotropical etching can be performed as illustrated in FIG. 2C. By using such an isotropical etching process, it is possible to etch both the micro-particles 12 and the rod-shaped fine structure 14 made of the material of the target object 11. Compared with the structure 14 shown in FIG. 2B, produced with FAB 13 only, it can be seen that a finer rod-shaped structure 14a can be produced. The residual micro-particles 12 which remain after the final etching process are usually unwanted, and they may be removed from the top of the rod-shaped structure 14a by a material removal process such as water-jet cleaning.

The type of the target object material, which can be processed by the energy-beam assisted microfabrication method, is not particularly restricted, and includes semiconductor substrate materials such as at least one of GaAs, Si SiO$_2$, insulation materials such as at least one of glass and ceramics, as well as metallic materials. For micro-particles 12, if ultra-fine particles of a particle size below 0.1 μm are required, at least one of ferrite, zinc, cobalt and diamond may be used, or if the particle size required is between 0.1 to 10 μm, micro-particles 12 of at least one of aluminum, graphite, gold and solver may be used. The selection of the material for micro-particles 12 should be made on the basis of its reactivity with the etching gas or its sputtering property.

FIGS. 3A–3E illustrate the processing steps in a second method of the microfabrication method. In the first embodiment the energy beam used was a fast atomic beam 13 of a rare gas or a gas which has a high reactivity with the base material but a low reactivity with the micro-particles to suppress the etching action on the micro-particles 12. FIGS. 3A–3E present a slightly different aspect of the microfabrication method. In this case, some allowance is made for the shape change (shrinking) in the micro-particles, and the target object 21 in this case is one of III–V group semiconductor materials, such as one of GaAs, AlGaAs, InAs. Fast atomic beam (FAB) 23 is gaseous chlorine, and the micro-particles 22 are nano-particles of diamond of a particle size between 1 to 50 nm which are reactive with the FAB 23.

First, as shown in FIG. 3A, diamond nano-particles 22 are dispersed on the surface of target object 21, and FAB 23 of gaseous chlorine is directed as shown by the arrow in FIG. 3A. The process of etching proceeds on the fabrication surface of the target object 21, as illustrated in FIGS. 3B, 3C, but at the same time, the diamond particles 22 are also etched, albeit at a low speed. As the size of the diamond particles shrinks, the protective shielding provided by the diamond particles 22 against the FAB 23 is also reduced. As the fabrication process is continued, that portion of the target object 21 which is protected by the diamond particle 22 decreases in size to produce a fine-tipped structure 24 as illustrated in FIG. 3D. When the process is continued until the diamond particle 22 disappears, the final structure produced is a cone-shaped fine structure 24 as shown in FIG. 3E. As an example, a cone-shaped fine structure 24 produced during testing exhibited a respectably high aspect ratio consisting of a tip diameter of 10 nm and a height of about 250 nm.

After the completion of the energy beam radiation step, further refinement on the tip shape of the fine-tipped structure 24 may be carried out by using isotropical etching by introducing only gaseous chlorine and heating the target object 21 with a heater or an infrared lamp. In such a case, a fine structure 24 having a tip dimension of 0.1 to 5.0 nm may be produced. By thermally assisting the chemical reaction in the post-FAB stage, it is possible to smooth out the surface or remove damaged surface layers from the surface of the target object 21. This approach is particularly effective in the production of quantum effect devices. Quantum effect refers to a property associated with a fine structure of a bulk material which is different than the corresponding property in the body or base of the bulk material itself, for example, shifting of the wavelength of input light to a shorter wavelength or a shift in the electron energy level. Using the quantum effect, it is possible to shift the wavelength of an output light beam or laser beam emitted from the fine structure to a shorter wavelength compared to the bulk wavelength. When a laser beam is passed through the fine structure, the wavelength of the output laser beam from the tip shifts to a shorter wavelength compared to the input wavelength, thereby increasing the output power of the laser emitted from the fine structure.

Figure 5:
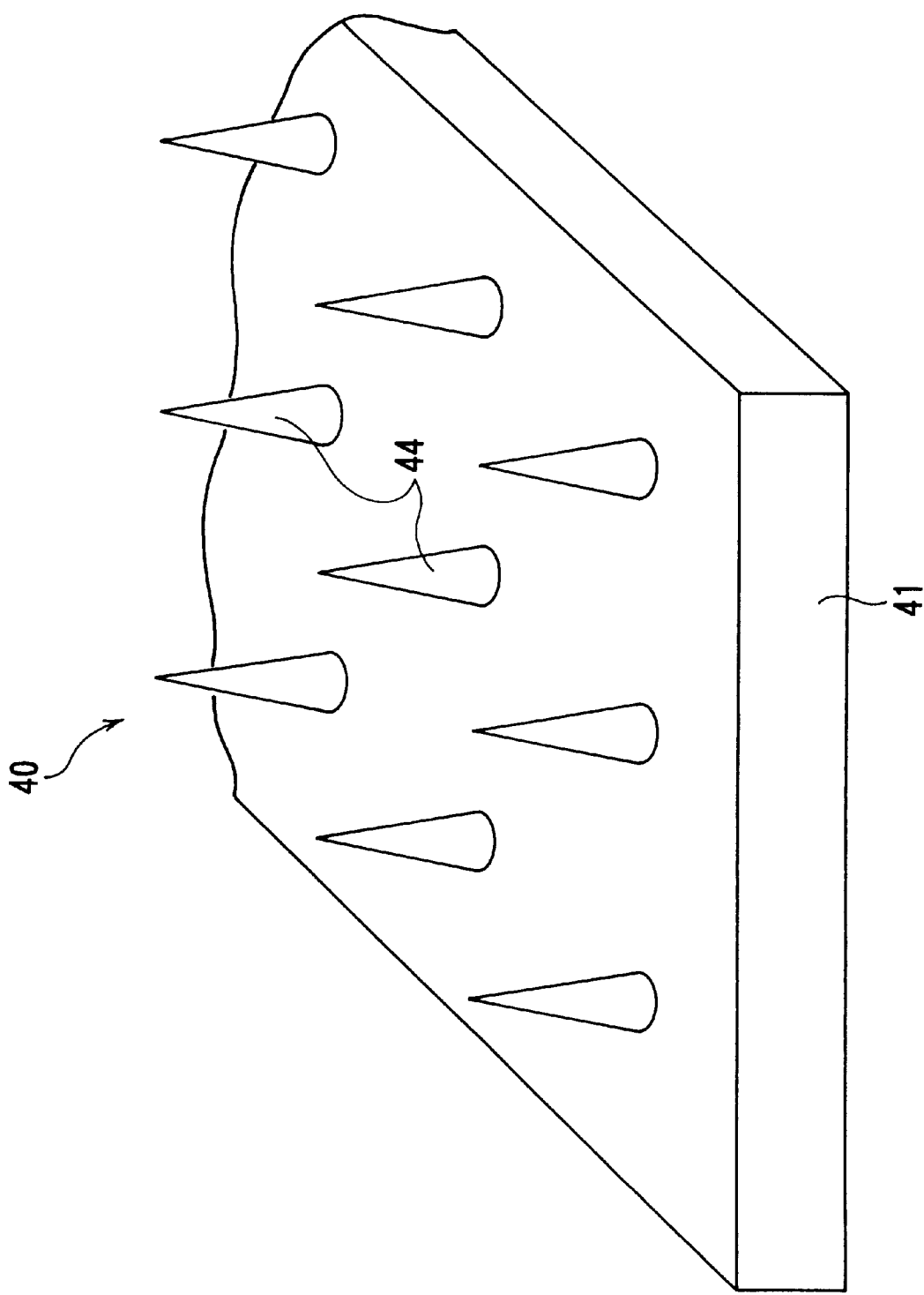
FIG. 5 is a perspective view of another example of fabrication performed by arranging micro-particles in a two-dimensional periodic pattern on a fabrication surface a target object, performed according to the microfabrication method of the present invention.

FIGS. 4 and 5 show examples of fabrication to produce fine structures 30, 40 by arranging the micro-particles in a two-dimensional periodic pattern on the fabrication surface of target object materials 31, 41. The fine structure 30 shown in FIG. 4 comprises an array of fine columns 34 (i.e., rod-shaped structures) on the surface of the target object 31 according to a given pattern (i.e., matrix distribution pattern). the fine structure 40 shown in FIG. 5 comprises an array of fine cones 44 (i.e., rod-shaped structures) on the surface of the target object 41 according to a matrix distribution pattern. The method of fabrication is basically the same as those described above, however, the control of the distribution of micro-particles 32 is based on a further advancement in the microfabrication method, carried out with laser-assisted, electric-field assisted, or magnetic-field assisted distribution of micro-particles, to control the matrix distribution pattern according to periodic distribution rather than statistical distribution. The effect of laser radiation is to ionize the micro-particles 32 themselves or ionize the boundaries of the micro-particles 32 to generate plasma status. Therefore, those micro-particles 32 which are radiated with a laser beam become ionized and charged. By applying an electric field on a laser-focused spot, the micro-particles 32 can be captured (trapped) and moved to a desired location. The resulting distribution is the micro-particles 32 being disposed on the target objects 31, 41 according to a matrix distribution pattern as illustrated in FIGS. 4 and 5.

When using an electric field effect instead of a laser beam, an electric field is applied to trapping electrodes to trap the micro-particles 32 and move them to the desired locations to produce a periodic array of fine structures. Further, when using a magnetic field effect, it is possible to utilize magnetic micro-particles such as ferrite powders dispersed in a solution, and produce a matrix distribution pattern along the magnetic flux lines of a magnetic field produced by electromagnets or permanent magnets. When the micro-particles 32 are to be distributed on a scale of nanometers, it is possible to utilize a piezo-electric element and apply a controlled voltage through electrodes or magnetic poles to expand or contract the piezo-electric element in a nanometer range to produce a desired matrix distribution pattern of desired accuracy.

Figure 6:
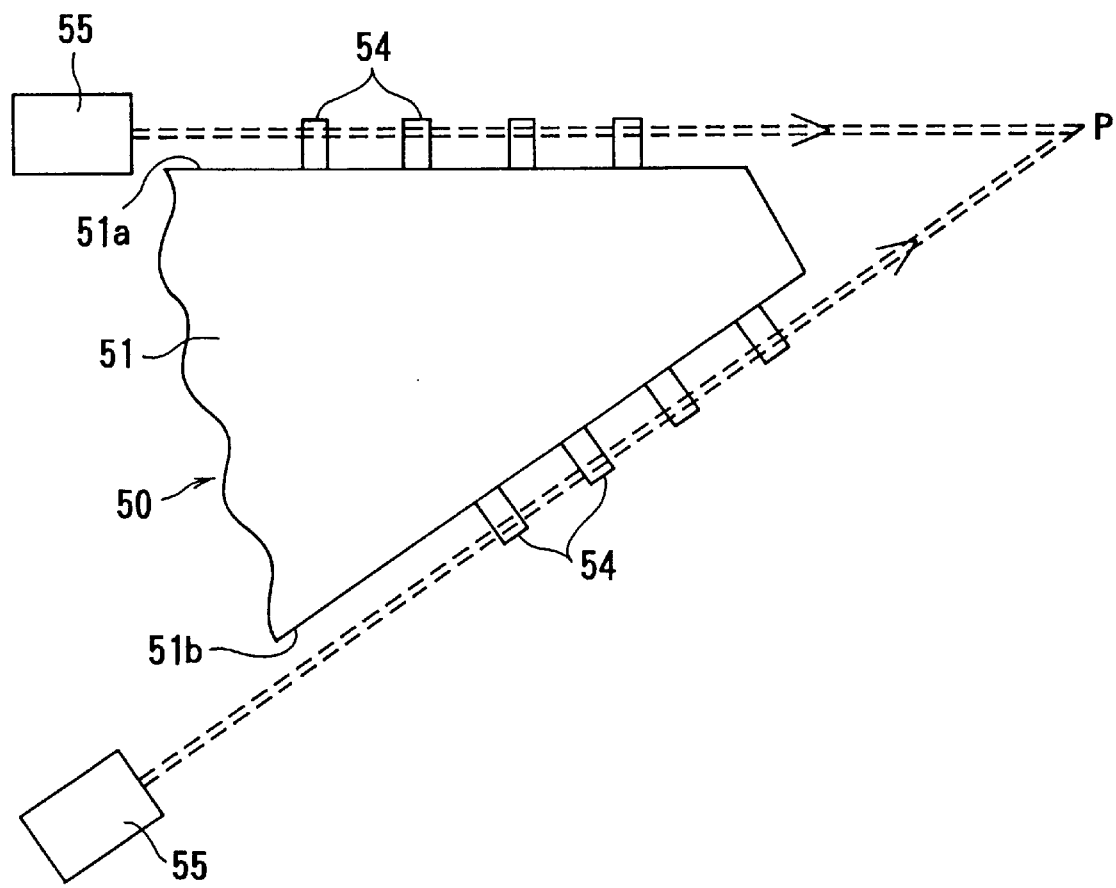
FIG. 6 is a cross-sectional view of an example of fabrication of two tip-shaped fine structures produces by the microfabrication method of the invention, each having a specific arrangement of rod-shaped fine structures, on mutually intersecting planes.

FIG. 6 is an example of the microfabrication method applied to a target object 50 having a periodic distribution pattern of a line or row of rod-shaped fine structures 54 disposed on each of two mutually intersecting side planes 51a, 51b of a target object 51 oriented at some angle. The diameter of the fine structure 54 is between 1 to 20 nm, and the height is between 10 to 500 nm. An optical axis passing through each of the two lines of the fine structure 54 merges at an intersection point P, and each of the fine structures 54 functions as a quantum effect optical amplifier to the laser beam input from each of laser generators 55. Such a device having the fine structures 54 can also function as a quantum effect laser generator when mirror resonators are placed on both sides of the fine structures 54. In such an optical device, the wavelength of the output laser can be shifted to a shorter wavelength or the device may act as an intense power optical oscillator so that an optical pulse field of extremely high power may be generated at the intersection point P. It will be recognized by those skilled in the art that such an intense power laser beam from such a device would have applications in many scientific and technical fields, including irradiation of materials to generate light, sputtering of atoms, ionization and severing of atomic chains, in addition to trapping of micro-particles developed in the methods described above.

Figure 7:
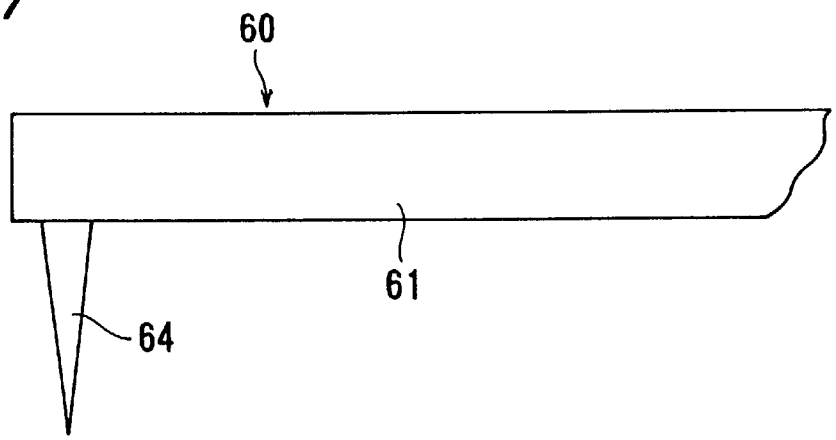
FIG. 7 is a side view of an example of a cone-shaped structure of Si fabricated on a target object according to a microfabrication method of the present invention.

The fabrication target material 60 shown in FIG. 7 is made on a silicon substrate base 61 in accordance with the steps presented in the second embodiment described above. Because the base material is silicon, the energy beam utilized is a fast atomic beam based on gaseous particles from a fluorine group, such as $SF_6$. Isotropical fabrication is performed in a post-FAB processing step, by producing a plasma of fluorine-group gas particles, and supplying a high concentration of fluorine radicals to the fabrication surface. The cone-shaped Si fine structure 64 thus produced can be used as a cantilever needle point in an atomic field microscope (AFM) or scanning tunnelling microscope (STM). The needle tip is used to examine the surface roughness configuration of a target object, based on the vertical movement of the needle tip moving along the surface. Because of the sharpness of the needle tip of the fine structure 64, it can make concentration of an electric field easy, and can, therefore, be used as an electron emission source in field emission applications. Field emission is a technique of generating a controlled beam of electrons by emitting an electron beam from a micro-emitter (such as the needle tip fine structure illustrated) encased in an insulator tube, and regulating the voltage on beam-guiding electrodes disposed at a beam exit port of the insulator tube to control the emission process. This type of electron beam can be used in electron beam drawing devices for nanometer range drawing.

FIG. 8 shows an example of a three-dimensional multi-surfaced element 70 produced by the microfabrication method of the invention. The cone-shaped fine structures 74 and the rod-shaped fine structures 75 are produced, according to the methods described above, on a top surface 71a and a side surface 71b, respectively, of a three-dimensional target object 71. Each of these fine structures 74, 75 exhibits a different quantum effect. The cone-shaped fine structures 74 having resonator mirrors 74a, 74b act as optical amplifiers for a laser beam L1, and the rod-shaped fine structures 75 having resonator mirrors 75a, 75b act as optical amplifiers for a laser beam L2. The fine structures 74, 75 generate laser beams of different wavelengths according to differences in their quantum effects.

In more detail, the generated laser beam L1 output through the output mirror 74b and the generated laser beam L2 output through the output mirror 75b have different wavelengths, but each beam is directed to a respective reflection mirror 76, 77 to change the direction of propagation at right angles, and is then directed to front face 71c of the target object 71. The laser beams guided to the front face 71c are separated or coupled by rotation mirror 78, and are input into a photodetector 79. The rotation mirror 78 is an optical mirror having a different wavelength selectivity on its front surface than its back surface so that one wavelength may be filtered or coupled to the other wavelength depending on the phase relation at the rotation mirror 78, thereby filtering or mixing the wavelengths of the laser beams L1 and L2.

The element 70, having the fine structural features presented above, can also be utilized in the field of optical communications. In this case, when a data group comprised of two different wavelengths is propagated through a common bus line or separate bus lines, the transmission time is halved compared with the case of propagating 16-bit data on a single wavelength. This is because the pulse data having two different wavelengths can be transmitted simultaneously through an optical fiber as a common bus line. In such an application, the photodetector 79 is provided with wavelength selectors for two wavelengths λ1, λ2, each having eight data lines for outputting data through preamplifiers and parallel signal processors to transmit 8-bit data to memories and other peripheral devices. In other words, the element 70 is able to simultaneously process 8-bit data carried on two wavelengths, thus enabling to transmit 2×8=16 bits of data in half the time. Similarly, by increasing the number of wavelengths, a multiple integer-number increase in data transmission speed can be achieved in the same duration of time. By having a plurality of elements 70, a large number of groups of information can be transmitted, depending on the number of wavelengths chosen, thus realizing a high capacity optical data transmission device.

Instead of the rotation mirror 78, a half mirror or an electrically-controlled polarizing mirror may also be used. The photodetector 79 may be replaced with two optical sensors tuned to two wavelengths λ1, λ2, and although it would be necessary to match the phases in this case, there would be no need for the output selection mirror 78. Another possibility is to provide more than two rod-shaped or cone-shaped fine structures on the element 70 so that many data groups can be transmitted on many different wavelengths.

A summary of the overall salient features of the energy beam-assisted microfabrication method will be reviewed below.

The method is based on attaching an positioning of shielding members, including micro-particles, on the surface of a target object, with a range of particle sizes of one of 1–10 nm, 10–100 nm and 100 nm to 10 μm. when an energy beam is radiated onto the surface, those areas not shielded ar fabricated, i.e., etched, thereby producing fine structures, which are of the order of the size of or smaller than the shielding members, that cannot be fabricated by the conventional photolithography approach. Because the shielding members are placed on the surface to be fabricated, they are free from rigid requirements of roughness or flatness of the surface. This permits a three-dimensional fine structure to be fabricated by placing the shielding members at any local areas or different faces of a target object. In contrast, the conventional photolithography is limited to highly flat, smooth two-dimensional surfaces. Otherwise, a photoresist film of a quality acceptable for photolithography cannot be produced on the surface. By combining the technique of unisotropical etching with the superior linearity of an energy beam, flexibility in fabrication can be further enhanced. By combining the method with the technique of positioning of the micro-particles on the surface by the use of a laser or magnetic-electrical field, it is possible to fabricate ultra-fine structures applicable to quantum effect devices, electronic and optical devices which are important not only in academic studies, but in industrial products of the future.

Another feature of the method of the invention is that it is able to produce fine-tipped structures on any type of material by a judicious combination of energy beams, material for the shielding member and the target material. When the etching condition is chosen to be non-selective, for example if the energy beam is based on gas particles reactive to the shielding member as well as to the target material, a fine-tipped structure can be produced by etching away the shielding member as well as the target material so that a cone-shaped structure is produced. On the other hand, when the etching condition is chosen to be selective, for example if the energy beam is based on gas particles reactive to the target material but not to the shielding member, shrinking of the micro-particles is suppressed, and a rod-shaped fine structure having vertical walls can be produced.

Shape control of the fine structures can be exercised in other ways. For example, if heat is applied locally to a fine structure to thermally control its reaction rate, it is possible to isotropically etch the fine structure. After fabricating a target object with an energy beam, a reactive particle of a gas, such as chlorine or fluorine gas, is introduced while heating the fine structure with a localized heating device so as to etch the fine structure to provide an isotropically etched structure. This approach produces etching not only on the micro-particles but also on the fine structure so that, compared with the case of fabrication by FAB only, it is possible to produce finer structures having controlled cross-sectional shapes.

A further advantage of the method of the invention is that an energy beam can be chosen from a wide variety of energy beams including one of a fast atomic beam, an ion or electron beam, a laser or radiation beam, and an atomic or molecular beam, depending on the nature of the target material and the micro-particles as the shielding member. For example, an electrically neutral fast atomic beam may be applied to one of metals, semiconductor and insulation materials as well as to many other types of materials. An ion beam is particularly effective for metals, and an electron beam with a reactive gas particle beam is useful in effecting fine localized etching of only the area radiated by the electron beam. A radiation beam is useful when used alone or with reactive gas particles to provide chemically-assisted fabrication based on a mutual interaction of the gas with the target material. An atomic or molecular beam based on reactive gas particles is useful to provide a low energy beam fabrication method.

Next, a method will be presented of evaluating the fabrication properties of an energy beam such as a fast atomic beam (FAB) for producing fine structures by radiating through a shielding pattern arranged on a fabrication surface of a target object. Some of these properties are operating parameters such as fabrication speed, area, and depth as well as properties related to the nature of the beam, such as selectivity and shaping capabilities.

FIG. 9A shows the depth of fabrication produced by a focused energy beam 13 as a function of the distance x from the center C of the beam 13. FIG. 9B shows a curve P relating the depths plotted on the y-axis to the position along the distance x plotted on the x-axis. As shown in FIGS. 9A, 9B, it is possible to evaluate the performance of an energy beam by dispersing the micro-particles 12 on the surface of a target object, radiating the surface perpendicularly with a focused beam to fabricate the surface, and observing the shape and the depth d of the fine structures 14 produced. The results are indicative of the distribution of local energies of the energy beam 13, of the depths of fabrication, of the density of the energy beam, and are also indicative of fabrication properties such as selectivity and penetration capabilities of the energy beam 13.

FIG. 10 is a schematic diagram of an apparatus used for evaluating the focusing performance of an FAB. The FAB generation device, regarded as an efficient means of microfabrication, was redesigned in this invention. Discharge electrodes and discharge ports were designed so that a plurality of high speed particles 25 emitted from a plurality of beam discharge ports of the FAB source 18 can be focused at a focal point F. The focal point F was chosen to that it was located at a distance L (in mm) below fabrication surface 11 a of target object 11 which is GaAs, and the fabrication surface 11a of the target 11 was heated with an infrared lamp 35. In this experiment, micro-particles having a particle size of several μm were attached to the surface 11a at a distribution density of several particles per 100 μm².

Figure 11A:
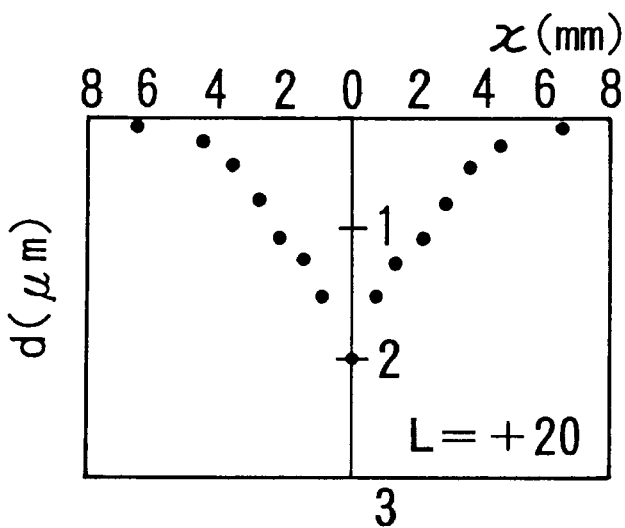
FIGS. 11A–11C are graphs showing the effects of changing a parameter L in the apparatus shown in FIG. 10 on the depth d of etching.
Figure 11B:
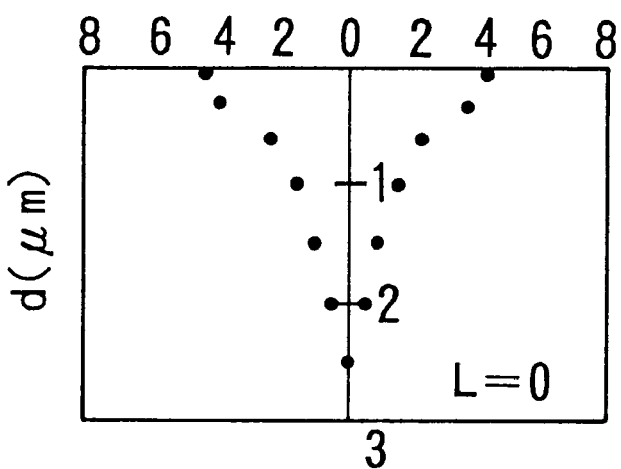
Figure 11C:
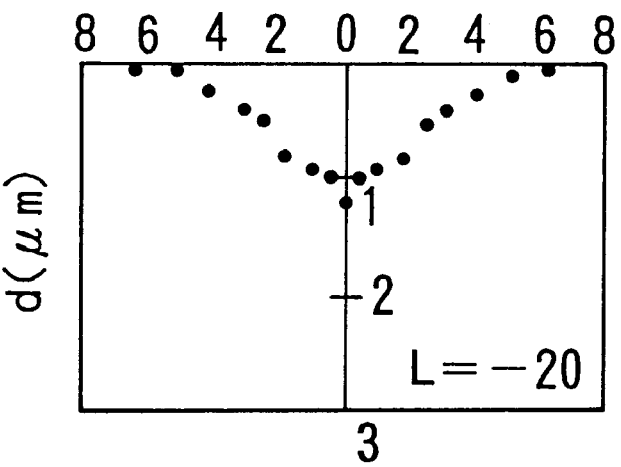

FIGS. 11A–11C are graphs showing the dependence of the depth of etching d (in μm) on the distance L (in mm) from the surface 11a to the focal point F. The distance L is positive (+) below the surface, and the horizontal axis is the same as in FIG. 9B, and represents the distance x (in mm) from the center C of the energy beam. The depth measurements were made with an electron microscope. FIGS. 11A–11C indicate that the depth of etching becomes larger towards the center C of the beam (x becomes closer to zero). The results indicate that the energy particle density is higher towards the focal point F. It follows that when L=0, a deep hole can be produced at the center of the beam, and as the distance L is increased (by moving the focal point F away from the surface 11a), etching becomes shallow but occurs over a wide area.

The salient features of the present invention presented to this point now will be briefly reviewed.

The findings demonstrated that etching of lines or spots of a diameter less than 1 μm (which are difficult to achieve with conventional technology) can be achieved easily by dispersing and attaching micro-particles of a given diameter on the fabrication surface of a material and processing with an energy beam. The micro-particles can be produced fairly readily over a wide range of particle sizes employable for the present invention. Thus, a relatively wide range of pattern sizes can be produced by the method of the invention. The performance characteristics of the energy beam can be evaluated simply and accurately, as described above, by dispersing and attaching micro-particles and radiating the fabrication surface of a material with a suitable energy beam, and studying the topography of the etched surface by electron microscopy.

Tests have also confirmed that even when the surface roughness of the target object is not suitable for the conventional photolithographic approach, the method of the present invention enables patterns to be produced over a much wider range of sized and depths than are achievable by the conventional photolithographic method, thereby making it possible to evaluate the performance characteristics of any energy beam over a wide range of sizes and patterns.

Energy beam is a general term used to describe a variety of energetic beams employable in the microfabrication method, such as a fast atomic beam, an ion beam, an electron beam, a laser beam, a radiation beam, an atomic or a molecular beam. The characteristics of these various beams are briefly summarized below. A fast atomic beam is a neutral particle beam and is applicable to all types of metals, semiconductors or insulators. An ion beam is particularly effective for metals. An electron beam is useful in localized processing when used in conjunction with reactive gases. A radiation beam is applicable to a variety of fabrication requirements when used alone or with reactive gases to utilize mutual interaction of the gas with the target material. An atomic or molecular beam is based on atomic particles or molecular particles of reactive gases, and is effectively used for providing a low energy beam for low damage fabrication.

Next, some examples of fabricating an arrayed structure by the microfabrication method of the invention will be demonstrated with reference to FIGS. 12A–12C through FIG. 14.

FIG. 12A shows a basic approach of the method. Rod-shaped shielding members 80 (for example, of a width ranging from one of 0.1–10 nm, 10–100 nm and 100 nm to 10 μm) are placed on the surface of a target object 11 (substrate base) to shield energy beam B directed from above. There is no need for holding devices for the shielding members 80, and it is sufficient to just position them in a suitable pattern. By choosing the type of energy beam B appropriately, the target object 11 is etched as illustrated in FIG. 12B to form an arrayed structure comprising a series of parallel line protrusions 81.

A suitable energy beam for this type of application is a fast atomic beam comprising uncharged particles having a good directional property. For the target object 11, Si, GaAs have been used, but other semiconductor materials, insulators such as glass, quartz, and metals may also be processed. The shielding member 80 may be made by electrolytic polishing of one of tungsten, gold, silver, platinum and nickel into a fine-wire form (of about 50 82 m diameter). The shielding members 80 may be held in place in a suitable manner on the substrate base.

In place of the material-removal process of etching presented thus far, it is possible to perform a material-addition process, such as forming of a deposition film as illustrated in FIG. 12C, by selecting the beam type and the energy level suitably. Using an energy level in a range of several to hundreds of eV, and gaseous sources such as methane for carbon together with an aluminum- or titanium-containing gas, insulative or conductive films can be deposited on the beam-radiated areas, thereby duplicating the arrangement of the pattern made by the shielding members 80.

Figure 13A:
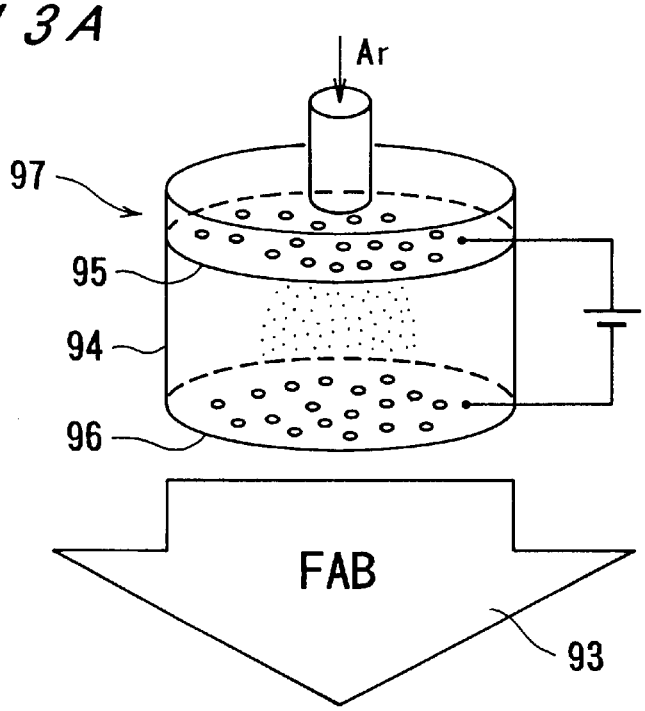
FIGS. 13A and 13B are schematic views of objects produced by placing a photoresist film in a periodic pattern.
Figure 13B:
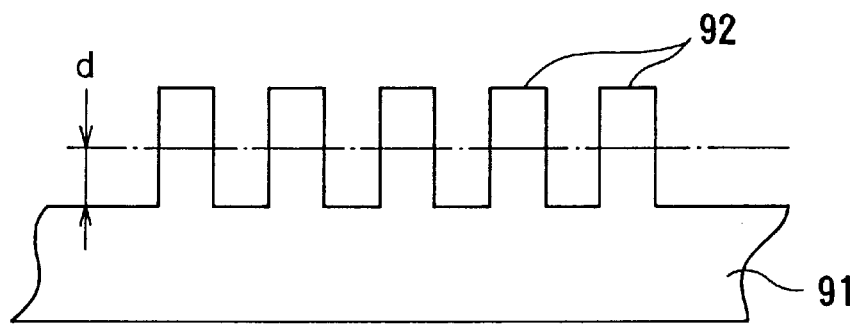

The examples shown in FIGS. 13A and 13B relate to microfabrication by a fast atomic beam 93 radiating a target object 91 coated with a photoresist film 92.

In the past, an ion or electron beam has been used for fabrication. However, because of the loss of linearity of a charged particle beam due to interference by electrical charges, or charge accumulation in the case of insulating material, it has been difficult to perform fabrication in the range of nanometers. Other fabrication techniques, such as reactive gas-assisted, ion beam or electron beam fabrication, involving the reaction of activated gas particles with the surface material, were also inadequate. In these techniques, the reactive gas particles are isotropic in their etching behavior, and directional etching was difficult, and high precision microfabrication could not be performed. In any case, none of the existing techniques is sufficiently adaptable to microfabricate local areas as well as a large area.

Because the conventional photolithographic technique is incapable of producing fine patterns in the nanometer range, the fine patterns on the photoresist film 92 on the surface of the target object 91 in these examples are produced by the technique of nano-lithography using SEM (Scanning Transmission Electron Microscope) or STM (Scanning Tunneling Microscope) or with the use of electron-beam holography. The target object 91 is made of a semiconductor material such as Si, $SiO_2$ or GaAs having pre-fabricated patterns of the photoresist film 92.

To microfabricate the target object 91 having a patterned photoresist film 92, a FAB 93 of a relatively large diameter is radiated to the surface as illustrated in FIG. 13A. The FAB 93 is generated from an argon gas FAB source 97, described in U.S. Pat. No. 5,216,241 for example, and comprising a discharge space formed by two (or three) flat-plate type electrodes 95, 96 contained in a housing 94, and introducing argon gas into the discharge space. The argon FAB source 97 produces an argon plasma in the discharge space by impressing a high voltage between both electrodes 95 and 96. The ionized gas particles are attracted to the negative electrode 96, where they collide with the gas molecules and combine with electrons to transform into fast atomic particles. The neutral particles are discharged from a discharge port in the negative electrode to provide a neutral fast particle beam. The relative position of the FAB source 97 and the target object 91 may be fixed or moved in a plane parallel to the target object 91 to produce a two-dimensional pattern on the fabrication surface. In this example, the position is shown to be fixed for convenience. Also, in the actual fabrication process, argon gas (Ar) is replaced with a gas having a high reactivity with the target object 91.

Because the FAB 93 emitted from the FAB source 97 is an electrically neutral beam, it is not affected by charge accumulation or electrical or magnetic fields, and exhibits a superior linearity. Therefore, the FAB 93 can be made to penetrate straight into ultra-fine holes or grooves, thereby enabling to fabricate even the bottom surfaces of deep grooves having a high aspect ratio. In the case of the embodiment illustrated, the width of the patterns fabricated on the photoresist film 92 ranged between 0.1–100 nm. The fabricated depth d, indicated in FIG. 13B, depends on the aspect ratio, but precision in fabricating the depth d ranged between 0.1–100 nm.

The results show that, unlike the problematic techniques of microfabrication based on an ion or electron beam, an advantage of microfabrication based on an electrically neutral FAB beam is that the superior linearity of the FAB is fully utilized to produce fine structures having a high aspect ratio, because a neutral FAB is not susceptible to local or irregular changes in electrical potential which affect the behavior of the ion or electron beam, the neutral FAB does not adversely affect the properties of a target semiconductor or insulator material. Therefore, the applicability of the technique is not limited by the nature of the target material.

Figure 14:
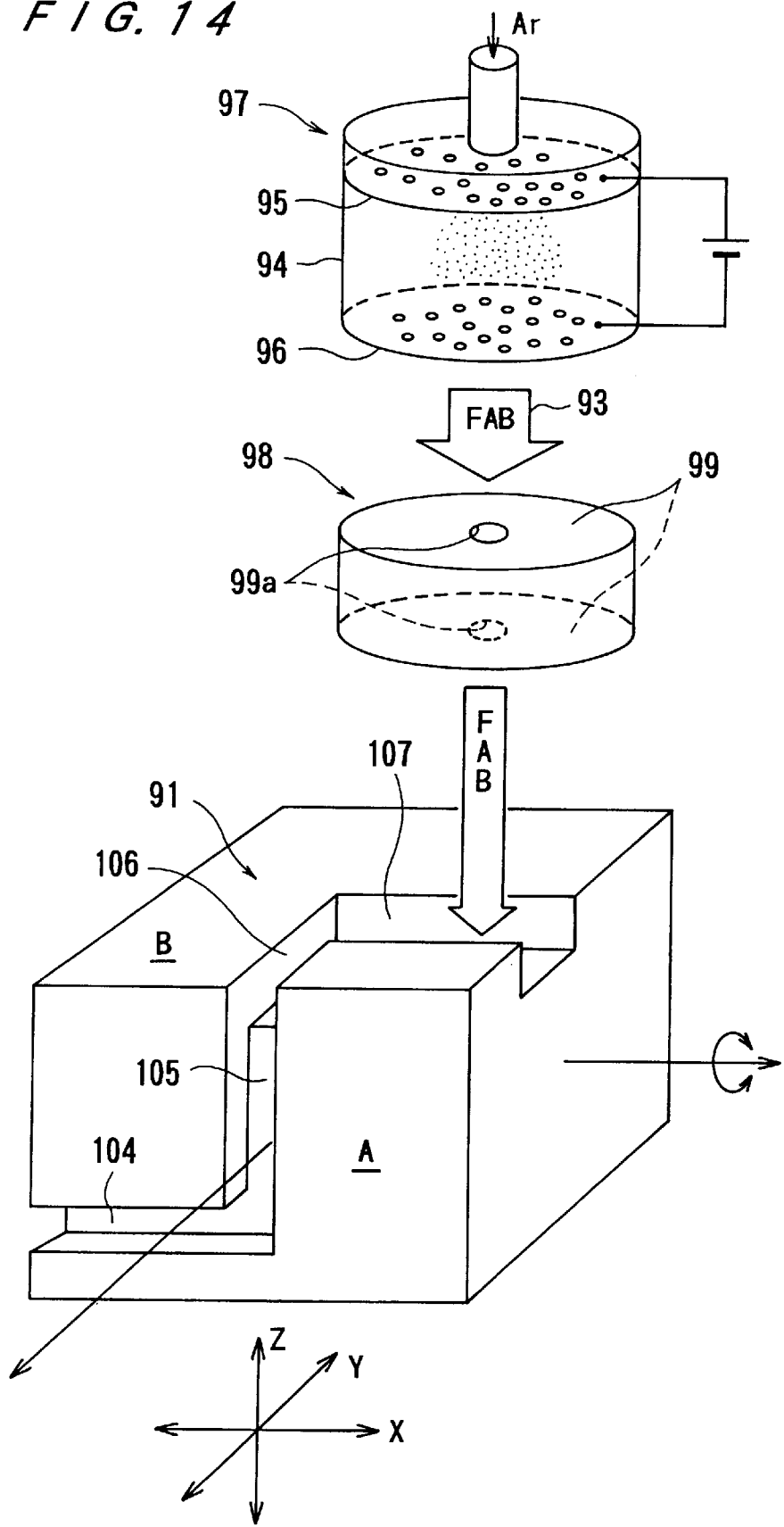
FIG. 14 is a schematic illustration of an example of a target object fabricated by a microfabrication method by moving a target object.
Figure 15A:
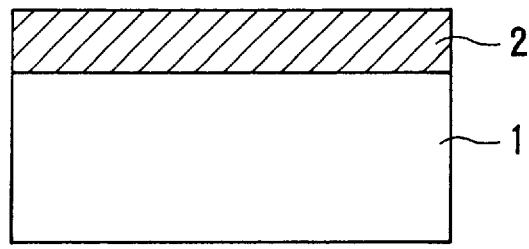
FIGS. 15A–15E illustrate five basic processing steps required in the conventional photolithography method of microfabrication.
Figure 15B:
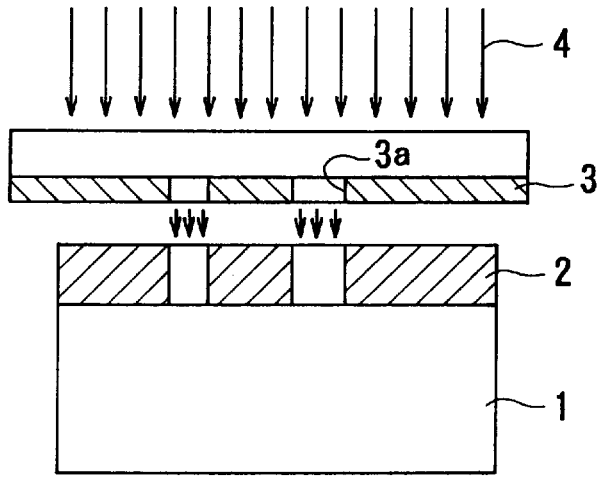
Figure 15C:
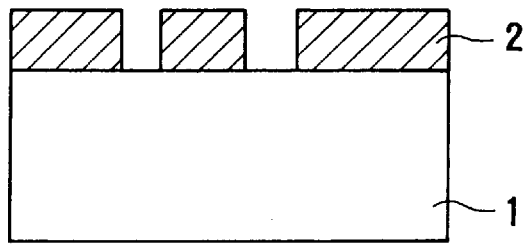
Figure 15D:
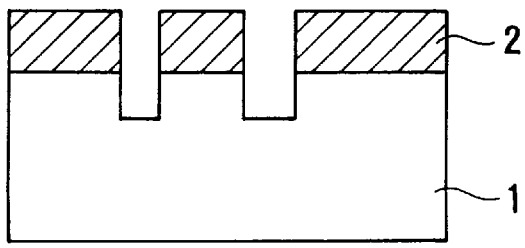
Figure 15E:
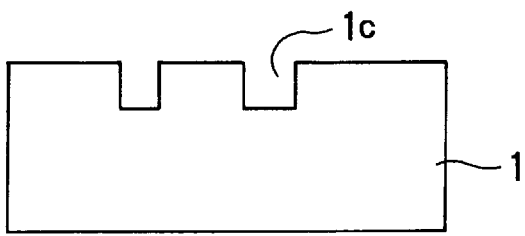

FIG. 14 illustrates another embodiment of the present invention in which an ultra-fine beam 93, in the range of 0.1–100 nm diameter from a FAB source 97, is radiated onto the fabrication surface of a target object 91 while moving the target object 91 relative to the source 97 so as to fabricate an ultra-fine three-dimensional pattern on the fabrication surface. In this case, the beam diameter is adjusted to produce an ultra-fine beam by disposing a beam aperture control device 98 between the FAB source 97 and the target object 91. The beam aperture control device 98 is provided with two or more shield plates 99 having ultra-fine pin holes 99a, and the linearity of the beam is enhanced by passing the beam through at least two pin holes 99a. The ultra-fine pin holes 99a are produced by removing atoms from the shield plate 99 while observing the images under a scanning tunnelling microscope (STM), for example. The FAB 93 emitted from the FAB source 97 is constricted by the beam aperture control device 98 to a required beam diameter, and is intensely focused on a target fabrication spot.

To produce a relative motion of the target object 91 with respect to the FAB source 97, the target object 91, in this case, is placed on a micro-manipulator stage which permits rotation/parallel movement (not shown) according to some pattern. In the case of target object 91 having the shape shown in FIG. 14, the FAB is always radiated in the negative direction along the Z-axis during the fabrication process. A channel 104 extending from an edge towards the middle of the target object 91, seen in the front face of the target object 91, is produced by orienting face A of target object 91 perpendicular to the Z-axis and moving the target object 91 in the negative direction along a plane parallel to the X-axis. When the channel 104 is extended to the middle of the target object 91, the target object 91 is moved in the negative direction parallel to the Y-axis to produce the channel 105 which extends to another edge of the target object 91. After thus completing the fabrication of two orthogonally intersecting channels 104 and 105, the target object 91 is rotated 90 degrees about the X-axis so that face B of target object 91 is oriented perpendicular to the Z-axis. Next, the target object 91 is moved in the negative direction parallel to the Y-axis to produce a channel 106 which extends towards the middle of the target object 91. When the channel 106 is extended to the middle of the target object 91, the target object 91 is moved in the negative direction parallel to the X-axis to produce a channel 107 which extends to another edge of the target object 91, thus producing another two orthogonally intersecting channels 106 and 107.

Accordingly, by moving the micro-manipulator to provide rotation combined with linear moving motions in a pre-programmed pattern, a three-dimensional pattern is fabricated on multiple surfaces of the target object 91. As in the cases of fabrications by electron beams or focused ion beams, the three-dimensional fabrication technique presented above does not require any reactive gas to be directed to the fabrication surface. Therefore, superior uniformity and precision of fabrication can be achieved. When the target object 91 is Si, a FAB comprised of gaseous particles such as $Cl_2$, or $SF_6$ or $CF_4$ may be used. When the target object 91 is GaAs, a FAB comprised of chlorine gas may be used.

In any of the methods presented above, the target object material is not limited to those used for semiconductor production such as Si, $SiO_2$ or GaAs, and ceramics, glass, resins and polymers can be fabricated equally effectively. In these materials also, fine patterns can be produced with high precision, because there is no danger of accumulating electrical charges or degradation in linearity of the beam caused by the electrical charges. The target object material may also be a functionary gradient material comprising at least two components of metals, semiconductors and insulator in various composite forms. The combination may be any of metals and semiconductors, metals and insulators, semiconductors and insulators, and metals and semiconductors and insulators. In these materials also, fine patterns can be produced over a large area without being affected by charge accumulation and loss of linearity.

As explained above, according to the method of the present invention, ultra-fine fabrication is possible with a precision range of 0.1 to 10 nm, 10 to 100 nm, either by radiating a fast atomic beam onto a target object having a fine-patterned photoresist film, or by radiating a fast atomic beam having an ultra-fine beam diameter onto the target object while rotating and/or translating the target object according to some pattern. In contrast to fabrication by an ion or electron beam (which is susceptible to local or irregular changes in electrical potential which may exist on the fabrication surface, as well as having a problem of degraded linearity of the beam itself), a fast atomic beam, which is an electrically neutral particle beam, is not affected by charge accumulation or by an electrical/magnetic field, and is able to produce superior fabrication by maintaining linearity of the beam during the fabrication process. As a result of the superior linearity of the beam, the fast atomic beam is able to be radiated straight into ultra-fine grooves and holes to enable ultra-fine fabrication over a large area of fabrication surface. Further, in contrast to an ion or electron beam which is unsuitable to large-area fabrication, the method is applicable to semiconductors, insulators, or any other types of materials over a large area, without adversely affecting their electrical properties. The method is further applicable to precision fabrication of an ultra-fine three-dimensional pattern by radiating an ultra-fine beam of fast atomic particles onto the fabrication surface and providing relative movement between the target object and the beam source according to the pattern.

Although certain preferred embodiments of the present invention have been shown and described in detail, it should be understood that various changes and modifications may be made therein without departing from the scope of the appended claims.

What is claimed is:

1. A method of ultra-fine fabrication of a surface of a target object comprising a semiconductor material composed of a group III element and a group V element of the periodic table, said method comprising:

dispersing on said surface a plurality of micro-particles such that said micro-particles form shields over first portions of said surface while remaining second portions of said surface remain unshielded; and radiating an energy beam toward said surface such that said energy beam etches said second portions thereof while said micro-particles shield said first portions thereof, thereby forming a fabricated target object including a base having fine structures protruding therefrom.

2. A method as claimed in claim 1, wherein said dispersing comprises applying to said surface a solution containing a dispersion of said particles and a solvent.

3. A method as claimed in claim 2, wherein said applying comprises immersing said target object in said solution.

4. A method as claimed in claim 3, wherein said dispersing further comprises removing said target object from said solution and evaporating said solvent from solution remaining on said surface, such that said micro-particles remain on said surface.

5. A method as claimed in claim 2, wherein said applying comprises dripping said solution onto said surface.

6. A method as claimed in claim 5, wherein said dispersing further comprises evaporating said solvent from said solution on said surface, such that said micro-particles remain on said surface.

7. A method as claimed in claim 1, wherein said micro-particles have a range of particle size of 0.1–10 nm.

8. A method as claimed in claim 1, wherein said micro-particles have a range of particle size of 10–100 nm.

9. A method as claimed in claim 1, wherein said micro-particles have a range of particle size of 100 nm–10 $\mu$m.

10. A method as claimed in claim 1, wherein said micro-particles have a range of particle size of 0.1–10 nm and are selected from the group consisting of ferrite particles, zinc particles, cobalt particles and diamond particles.

11. A method as claimed in claim 1, wherein said micro-particles have a range of particle size of 100 nm–10 $\mu$m, and are selected from the group consisting of aluminum particles, graphite particles, gold particles and silver particles.

12. A method as claimed in claim 1, comprising radiating said energy beam toward said surface in a direction substantially perpendicular thereto.

13. A method as claimed in claim 1, wherein said energy beam comprises a beam selected from the group consisting of a fast atomic beam, an ion beam, an electron beam, a radiation beam, an atomic beam and a molecular beam.

14. A method as claimed in claim 1, wherein said energy beam etches said second portions while substantially not etching said micro-particles, such that said fine structures are formed to have a rod shape.

15. A method as claimed in claim 1, wherein, as said energy beam etches said second portions, said energy beam also progressively etches said micro-particles, such that said fine structures are formed to have a cone shape.

16. A method claimed in claim 1, further comprising exposing said target object to gaseous particles that are reactive with said target object, thereby performing isotropical etching of said fine structures.

17. A method as claimed in claim 16, further comprising controlling the temperature of said target object during exposure to said gaseous particles, and thereby controlling the chemical reaction of said gaseous particles on said target object and controlling said isotropical etching.

18. A method as claimed in claim 1, wherein said dispersing and positioning comprises locating separate said microparticles at spaced, separate locations on said surface.

19. A method as claimed in claim 1, wherein said fine structures have a property different from a corresponding property of said base.

20. A method of ultra-fine fabrication of a surface of a target object comprising a semiconductor material selected from at least one of a group consisting of GaAs, InAs, AlGaAs and InGaAs, said method comprising:

dispersing on said surface a plurality of micro-particles such that said micro-particles form shields over first portions of said surface while remaining second portions of said surface remain unshielded; and radiating an energy beam toward said surface such that said energy beam etches said second portions thereof while said micro-particles shield said first portions thereof, thereby forming a fabricated target object including a base having fine structures protruding therefrom.

21. A method of ultra-fine fabrication of a surface of a target object, said method comprising:

dispersing on said surface a plurality of micro-particles such that said micro-particles form shields over first portions of said surface while remaining second portions of said surface remain unshielded;

generating a fast atomic beam having a large diameter from a beam source having flat plate electrodes; and radiating said beam toward said surface such that said beam etches said second portions thereof while said micro-particles shield said first portions thereof, thereby forming a fabricated target object including a base having fine structures protruding therefrom.

22. A method as claimed in claim 21, wherein said dispersing comprises applying to said surface a solution containing a dispersion of said particles and a solvent.

23. A method as claimed in claim 22, wherein said applying comprises immersing said target object in said solution.

24. A method as claimed in claim 23, wherein said dispersing further comprises removing said target object from said solution and evaporating said solvent from solution remaining on said surface, such that said micro-particles remain on said surface.

25. A method as claimed in claim 22, wherein said applying comprises dripping said solution onto said surface.

26. A method as claimed in claim 25, wherein said dispersing further comprises evaporating said solvent from said solution on said surface, such that said micro-particles remain on said surface.

27. A method as claimed in claim 21, wherein said micro-particles have a range of particle size of 0.1–10 nm.

28. A method as claimed in claim 21, wherein said micro-particles have a range of particle size of 10–100 nm.

29. A method as claimed in claim 21, wherein said micro-particles have a range of particle size of 100 nm–10 $\mu$m.

30. A method as claimed in claim 21, wherein said micro-particles have a range of particle size of 0.1–10 nm and are selected from the group consisting of ferrite particles, zinc particles, cobalt particles and diamond particles.

31. A method as claimed in claim 21, wherein said micro-particles have a range of particle size of 100 nm–10 $\mu$m, and are selected from the group consisting of aluminum particles, graphite particles, gold particles and silver particles.

32. A method as claimed in claim 21, comprising radiating said energy beam toward said surface in a direction substantially perpendicular thereto.

33. A method as claimed in claim 21, wherein said energy beam etches said second portions while substantially not etching said micro-particles, such that said fine structures are formed to have a rod shape.

34. A method as claimed in claim 21, wherein, as said energy beam etches said second portions, said energy beam also progressively etches said micro-particles, such that said fine structures are formed to have a cone shape.

35. A method as claimed in claim 21, wherein said target object comprises a semiconductor material composed of a group III element and a group V element of the periodic table.

36. A method as claimed in claim 21, wherein said target object comprises a semiconductor material selected from at least one of a group consisting of GaAs, InAs, AlGaAs and InGaAs.

37. A method as claimed in claim 21, wherein said target object comprises a semiconductor material selected from the group consisting of Si and $SiO_2$.

38. A method claimed in claim 21, further comprising exposing said target object to gaseous particles that are reactive with said target object, thereby performing isotropical etching of said fine structures.

39. A method as claimed in claim 38, further comprising controlling the temperature of said target object during exposure to said gaseous particles, and thereby controlling the chemical reaction of said gaseous particles on said target object and controlling said isotropical etching.

40. A method as claimed in claim 21, wherein said dispersing and positioning comprises locating separate said micro-particles at spaced, separate locations on said surface.

41. A method as claimed in claim 21, wherein said fine structures have a property different from a corresponding property of said base.

* * * * *